United States Patent [19]
Laban

[11] Patent Number: 6,079,989
[45] Date of Patent: Jun. 27, 2000

[54] ELECTRICAL CONNECTION DEVICE HAVING ELECTRICAL CONNECTION MEMBERS WITH A TUBULAR BODY AND A SLIDING TIP

[75] Inventor: Philippe Laban, Benejacq, France

[73] Assignee: STMicroelectronics S.A., Gentilly, France

[21] Appl. No.: 09/299,264

[22] Filed: Apr. 26, 1999

[30] Foreign Application Priority Data

Apr. 28, 1998 [FR] France ................................ 98-05312

[51] Int. Cl.$^7$ .......................... G01R 31/02; H01R 12/04; H01R 12/32; H05K 1/00
[52] U.S. Cl. ............................ 439/70; 439/72; 324/754; 324/755; 324/758; 324/761
[58] Field of Search ................ 439/70–73, 264; 324/754–762

[56] References Cited

U.S. PATENT DOCUMENTS

| | | |
|---|---|---|
| 3,382,437 | 5/1968 | Illington . |
| 3,891,898 | 6/1975 | Damon ................................ 439/70 X |
| 5,473,258 | 12/1995 | Abe . |
| 5,493,237 | 2/1996 | Volz et al. ............................ 324/754 |
| 5,500,605 | 3/1996 | Chang ................................ 324/758 |
| 5,506,512 | 4/1996 | Tozawa et al. . |
| 5,945,838 | 8/1993 | Gallagher et al. ..................... 324/761 |
| 5,952,839 | 9/1999 | Fredrickson ......................... 324/754 |
| 5,952,843 | 9/1999 | Vinh ................................ 324/761 |

FOREIGN PATENT DOCUMENTS 0 189 179 A1  7/1986  European Pat. Off. .

OTHER PUBLICATIONS

French Search Report dated Jan. 11, 1999 with annex on French Application No. 9805312.

"Test Probes with Retainer Ring", IBM Technical Disclosure Bulletin, vol. 35, No. 7, Dec. 1992, pp. 59–60, Armonk, New York, US.

*Primary Examiner*—Stanley J. Witkowski
*Attorney, Agent, or Firm*—Theodore E. Galanthay; Fleit, Kain,Gibbons, Gutman & Bongini PL

[57] ABSTRACT

An electrical connection device for electrically connecting an electronic component of the type having electrical connection points. The electrical connection device includes electrical connection members that each have a tip that can retract against an elastic means, a support carrying the electrical connection members, and a movable receptacle. The movable receptacle can house an electronic component and can bring the electronic component into a connection position in which the tips of the electrical connection members bear on the electrical connection points of the electronic component. In a preferred embodiment, the electrical connection members are removable from the device. Additionally, a testing apparatus that includes such an electrical connection device is provided.

17 Claims, 3 Drawing Sheets

ELECTRICAL CONNECTION DEVICE HAVING ELECTRICAL CONNECTION MEMBERS WITH A TUBULAR BODY AND A SLIDING TIP

CROSS-REFERENCE TO RELATED APPLICATIONS

This application is based upon and claims priority from prior French Patent Application No. 98-05312, filed Apr. 28, 1998, the entire disclosure of which is herein incorporated by reference.

BACKGROUND OF THE INVENTION

1. Field of the Invention

The present invention relates to electronic components, and more specifically to an electrical connection device for electrically connecting an electronic component that has electrical contact points.

2. Description of Related Art

Many conventional electronic components are formed by packages containing an integrated circuit with electrical contact points formed by solder balls on one side of the package. Such an electrical component is soldered to an application card by melting the balls. If there is a problem during application testing, the package is desoldered from the application card. However, after the desoldering of the package, the electronic component can no longer be electrically analyzed.

SUMMARY OF THE INVENTION

In view of these drawbacks, it is an object of the present invention to overcome the above-mentioned drawbacks and to provide an electrical connection device that makes it possible to test contact-point packages that are desoldered from an application card for such purposes as analyzing faults.

One embodiment of the present invention provides an electrical connection device for electrically connecting an electronic component of the type having electrical connection points. The electrical connection device includes electrical connection members that each have a tip that can retract against an elastic means, a support carrying the electrical connection members, and a movable receptacle. The movable receptacle can house an electronic component and can bring the electronic component into a connection position in which the tips of the electrical connection members bear on the electrical connection points of the electronic component. In a preferred embodiment, the electrical connection members are removable. A testing apparatus that includes such an electrical connection device is also provided.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
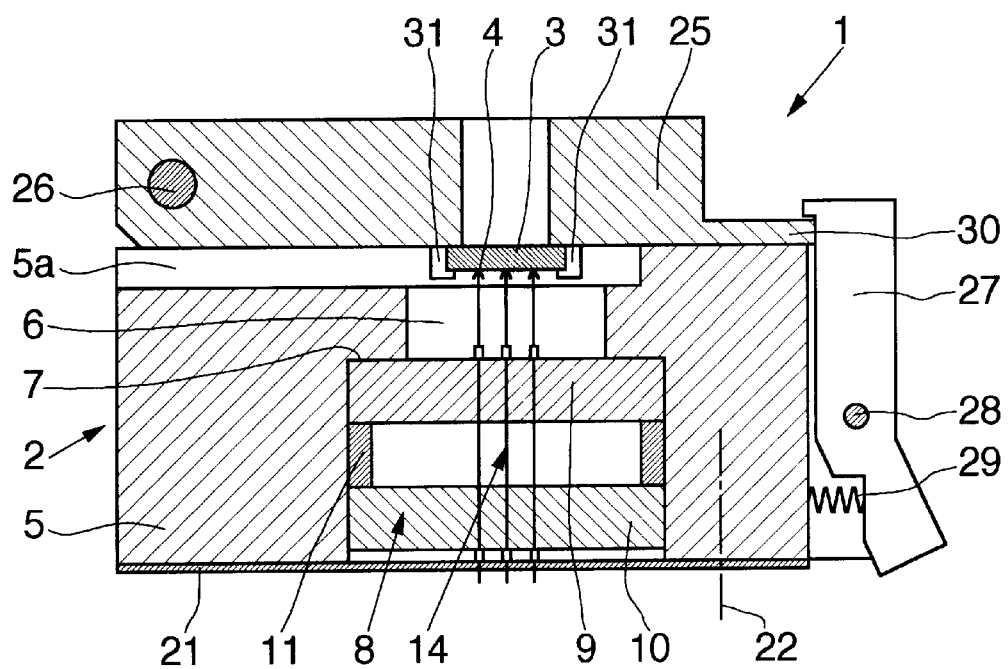
FIG. 1 shows a longitudinal section of a preferred embodiment of an electrical connection device with an electronic component in a connected position.
Figure 2:
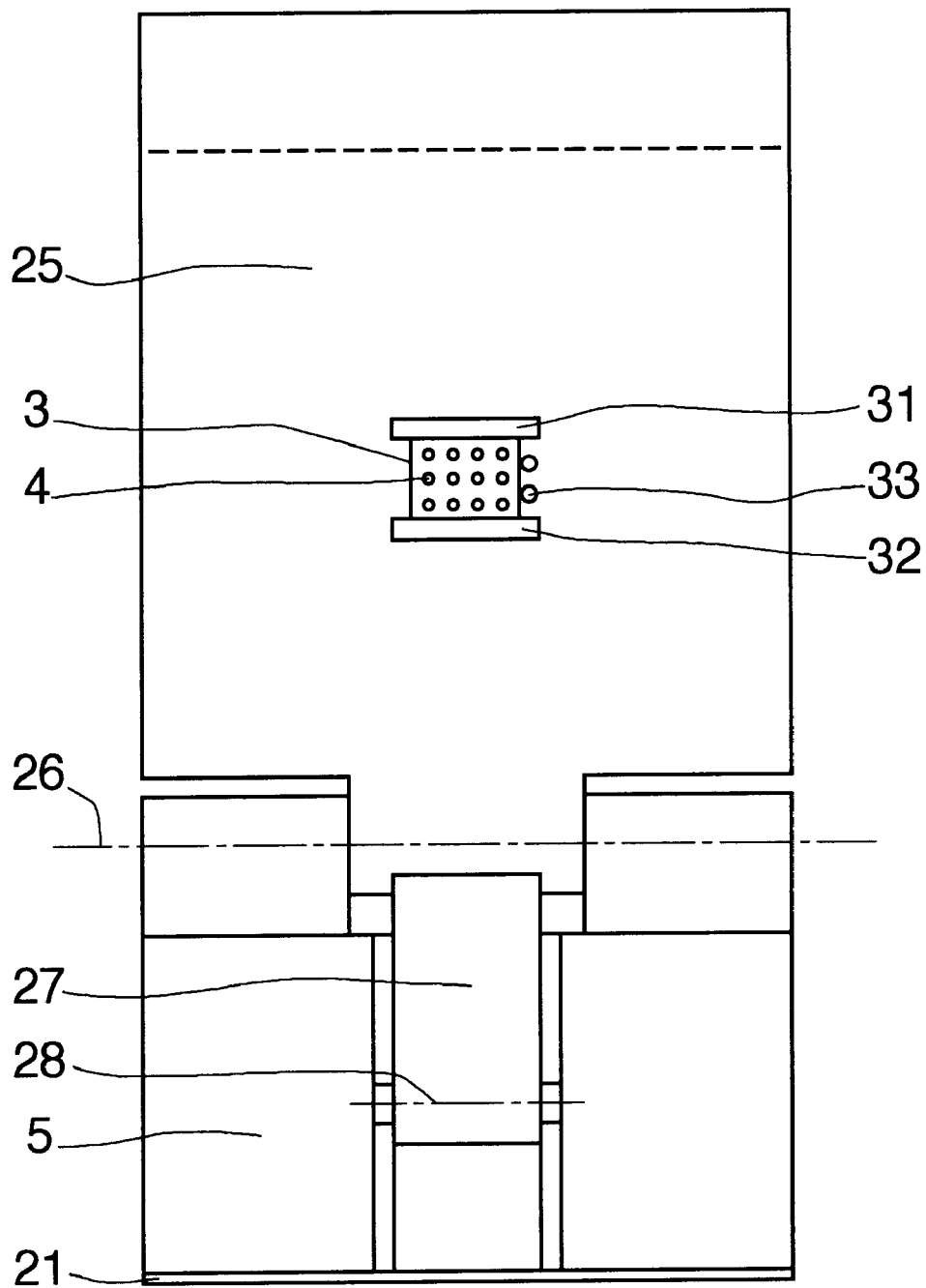
FIG. 2 shows a side view of the electrical connection device of FIG. 1 with the electronic component in a disconnected position.
Figure 3:
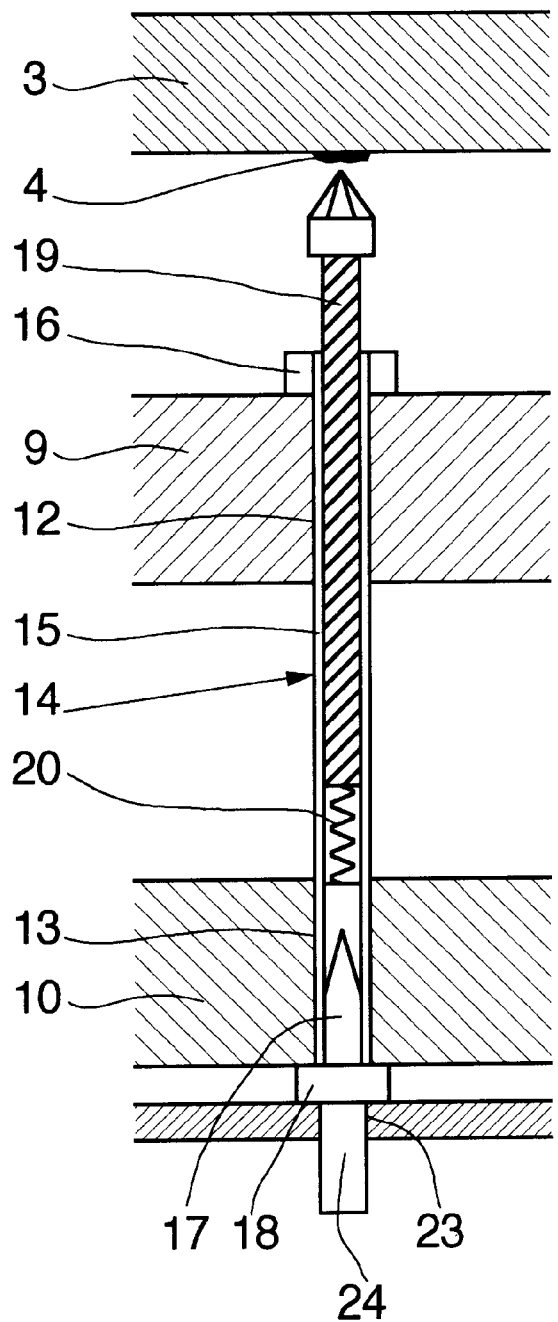
FIG. 3 shows a cross-section of a connection member of the electrical connection device of FIG. 1.

As shown in FIGS. 1 through 3, an electrical connection device 1 includes a support 2 made of a non-conducting material for housing an electronic component 3 of the type formed by a package containing an integrated circuit with electrical connection points 4 arranged in a matrix on one side of the package. The support 2 includes a body 5 of parallelepipedal shape that has a vertical through-passage 6 in which a downwardly facing shoulder 7 is provided. Removably placed in this passage 6 is an assembly 8 of two plates 9 and 10 that are separated by a certain distance and linked together by lateral spacers 11. The upper plate 9 comes into contact with the shoulder 7 and the lower face of the lower plate 10 is short of the lower face of the body 5.

The plates 9 and 10 have multiple corresponding through-holes 12 and 13 through which are placed multiple electrical connection members 14 having vertical axes. The connection members are placed in registration with the matrix of connection points 4 of the electronic component 3. Each of the connection members 14 includes a tubular body 15 passing through the upper plate 9 and engaged in the lower plate 10. The upper end of the tubular body 15 has a shoulder 16 that bears on the upper face of the upper plate 9 and a needle 17 that is forcibly engaged into the lower end of the tubular body 15 such that the tubular body is held in the hole 13 in the lower plate 10. The needle 17 has a shoulder 18 that bears on the lower face of the lower plate 10. Each of the connection members 14 also include a retractable tip 19 that extends telescopically into the cylindrical body 15 and projects upwards. The tip is upwardly subjected to a spring 20 that is placed in the tubular body 15 between the lower end of the tip 19 and the needle 17.

Additionally, support 2 includes a bottom plate 21 that is fixed against the lower face of the body 5 by means of fixing screws 22 such that the shoulders 18 of the needles 17 of the electrical connection members 14 are held between the lower face of the lower plate 10 and the upper face of the bottom plate 21. Thus, the assembly 8 carrying the connection members 14 is kept in position in the passage 6. The bottom plate 21 has multiple through-holes 23 through which appendages 24 of the needles 17 extend, so as to project downwards to allow electrical connections to be established between the electrical connection members 14 and an external apparatus.

The support 2 also includes a receptacle 25 formed by a plate that can bear on the upper face of the body 5. For this purpose, the receptacle 25 is mounted in a pivoted fashion on the support 5 by means of a pivot pin 26 provided through the edges such that the receptacle 25 can be lowered and raised. In order to keep the receptacle 25 in its lowered position, the body 5 carries a hook 27 that pivots on a pin 28 and is subjected to a spring 29. The hook comes into engagement with a portion 30 of the receptacle 25 on the opposite side of the pivot pin 26. On the face of the receptacle 25 that can bear on the body 5 of the support 2, there are provided two parallel positioning slideways 31 and 32 that extend parallel to the pivot pin 26 and have rims. The slideways can house the electronic component 3 between them by sliding on the face of the receptacle 25 and beneath the rims, with the travel of the electronic component being limited by positioning stops 33.

When the receptacle 25 is in the raised position, the electronic component 3 can be placed between the slideways 31 until it is brought against the stops 33 with its electrical connection points 4 opposite the receptacle 25. Then, the receptacle 25 is brought into the lowered position in engagement with the hook 27, and the body 5 of the support 2 has a recess Sa in which the slideways 31 and 32 engage freely. In the final part of travel, the electrical connection points 4 of the electronic component 3 come to bear on the tips 19 of the electrical connection members 14 so as to press them into their tubular bodies 15 and compress their springs 20.

This allows the electrical connection points 4 of the electronic component 3 to be electrically connected to an external apparatus through the electrical connection members 14 by connecting the appendages 24 of the members to the apparatus. Then, it is possible to carry out electrical measurements on the electronic component 3 using the apparatus. Because the electrical connection members 14 have telescopic tips 19 subjected to springs 20, the desired electrical connections can be obtained regardless of the quality of the electrical connection points 4 of the electronic component 3. In particular, electrical connection is obtainable even if some of the electrical connection points 4 of the electronic component 3 are damaged or not coplanar.

Further, because the electrical connection points 4 of the electronic component 3 are generally very close to each other and the electrical connection members 14 have small cross-sections, the electrical connection members 14 can become damaged during use. In particular, the tips 19 of the electrical connection members can become twisted. To replace such a damaged electrical connection member 14, all that is required is to remove the bottom plate 21 of the body 5, extract the assembly 8 carrying the electrical connection members 14, pull out the needle 17 of the damaged electrical connection member 14, extract its tubular body 15 (with its tip 19) from the top, and replace the damaged member 14 with a new electrical connection member that is fitted as described above. Then, the repaired assembly 8 is refitted into the passage 6 in the body 5 of the support 2 and the bottom plate 21 is again fixed to the body 5.

Furthermore, if it is required to carry out measurements on an electronic components 3 with a different matrix of electrical connection points 4, all that is required is for a new assembly 8 and a new bottom plate 21, which have been made so as to have electrical connection members 14 that are in registration with the matrix of electrical connection points 4 of the new electronic component, to be fitted into the passage 6 in the body 5 of the support 2.

In preferred embodiments of the present invention, each of the electrical connection members includes a tubular body that is engaged through a hole in a plate of the support, a first shoulder that bears on one face of the plate, a needle that is forcibly engaged in the tubular body, and a second shoulder that bears on another face of the plate. Additionally, in preferred embodiments, the plate is removably fitted into a through-passage in the support, and the support includes another plate that is fixed such that the second shoulders of the electrical connection members are held between the plate and the other plate.

Further, in one preferred embodiment, the movable receptacle includes opposed positioning slideways for engaging the electronic component, and a positioning stop that limits travel of the electronic component between the slideways. The movable receptacle is mounted to the support in a pivotable fashion, and the support carries a latch for holding the movable receptacle with the electronic component in the connection position.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. An electrical connection device for electrically connecting an electronic component of the type having a plurality of electrical connection points, said electrical connection device comprising:

a plurality of electrical connection members, each of the electrical connection members having a tubular body, an elastic means, a sliding tip that protrudes from a first end of the tubular body, and a removable needle that is forcibly engaged in a second end of the tubular body, the tip being retractable against the elastic means;

a support carrying the electrical connection members, the support including at least one plate that has holes through which the tubular bodies of the electrical connection members are engaged; and a movable receptacle for housing an electronic component and for bringing the electronic component into a connection position in which the tips of the electrical connection members bear on the electrical connection points of the electronic component, wherein each of the electrical connection members further includes a first shoulder attached to the tubular body and bearing on a first face of the at least one plate, and a second shoulder attached to the needle and bearing on a second face of the at least one plate, which is opposed to the first face, such that the at least one plate is held between the first shoulder of the tubular body and the second shoulder of the needle, and the electrical connection members are removable from the device.

2. The electrical connection device as defined in claim 1, wherein the electrical connection members are individually removable from the device by removing the corresponding needle.

3. The electrical connection device as defined in claim 1, wherein the at least one plate is removably fitted into a through-passage in the support, and the support includes a second plate that is fixed such that the second shoulders of the electrical connection members are held between the at least one plate and the second plate, and the needles extend through the second plate.

4. The electrical connection device as defined in claim 1, wherein the movable receptacle includes:

opposed positioning slideways having rims, the electronic component being able to be engaged between the slideways; and a positioning stop that limits travel of the electronic component between the slideways.

5. The electrical connection device as defined in claim 1, wherein the movable receptacle is mounted to the support in a pivotable fashion.

6. The electrical connection device as defined in claim 5, wherein the support carries a latching means for holding the movable receptacle with the electronic component in the connection position.

7. The electrical connection device as defined in claim 6, wherein the latching means is a latch or hook.

8. The electrical connection device as defined in claim 1, wherein the elastic means is a spring or counterforce.

9. The electrical connection device as defined in claim 1, wherein the second shoulder of the needle maintains the connection member in the absence of an electronic component in the connection position, and the first shoulder of the tubular body maintains the connection member when an electronic component is in the connection position.

10. A testing apparatus for testing an electronic component of the type having a plurality of electrical connection points, the testing apparatus including testing circuitry and an electrical connection device for electrically connecting the electronic component to the testing circuitry, said electrical connection device comprising:

a plurality of electrical connection members, each of the electrical connection members having a tubular body, an elastic means, a sliding tip that protrudes from a first end of the tubular body, and a removable needle that is forcibly engaged in a second end of the tubular body, the tip being retractable against the elastic means;

a support carrying the electrical connection members, the support including at least one plate that has holes through which the tubular bodies of the electrical connection members are engaged; and a movable receptacle for housing an electronic component and for bringing the electronic component into a connection position in which the tips of the electrical connection members bear on the electrical connection points of the electronic component, wherein each of the electrical connection members further includes a first shoulder attached to the tubular body and bearing on a first face of the at least one plate, and a second shoulder attached to the needle and bearing on a second face of the at least one plate, which is opposed to the first face, such that the at least one plate is held between the first shoulder of the tubular body and the second shoulder of the needle, and the electrical connection members are removable from the device.

11. The testing apparatus as defined in claim 10, wherein the electrical connection members are individually removable from the electrical connection device by removing the corresponding needle.

12. The testing apparatus as defined in claim 10, wherein the at least one plate is removably fitted into a through-passage in the support, and the support includes a second plate that is fixed such that the second shoulders of the electrical connection members are held between the at least one plate and the second plate, and the needles extend through the second plate.

13. The testing apparatus as defined in claim 10, wherein the movable receptacle includes:

opposed positioning slideways having rims, the electronic component being able to be engaged between the slideways; and a positioning stop that limits travel of the electronic component between the slideways.

14. The testing apparatus as defined in claim 10, wherein the movable receptacle is mounted to the support in a pivotable fashion.

15. The testing apparatus as defined in claim 14, wherein the support carries a latching means for holding the movable receptacle with the electronic component in the connection position.

16. The testing apparatus as defined in claim 10, wherein the elastic means is a spring or counterforce.

17. An electrical connection device for electrically connecting an electronic component of the type having a plurality of electrical connection points, said electrical connection device comprising:

a plurality of electrical connection members, each of the electrical connection members having a tubular body, an elastic means, a sliding tip that protrudes from a first end of the tubular body, and a removable needle that is forcibly engaged in a second end of the tubular body, the tip being retractable against the elastic means;

a support carrying the electrical connection members, the support including holes through which the tubular bodies of the electrical connection members are engaged; and a movable receptacle for housing an electronic component and for bringing the electronic component into a connection position in which the tips of the electrical connection members bear on the electrical connection points of the electronic component, wherein each of the electrical connection members further includes a first shoulder integral with the tubular body and bearing on the support adjacent to a first end of one of the holes in the support, and a second shoulder integral with the needle and bearing on the support adjacent to a second end of the hole in the support, such that at least a portion of the support is held between the first shoulder of the tubular body and the second shoulder of the needle.

\* \* \* \* \*